(12) United States Patent
Rodriguez et al.

(10) Patent No.: US 10,877,098 B2
(45) Date of Patent: Dec. 29, 2020

(54) METHOD FOR DETECTING A FAULT IN AN ELECTRICAL MACHINE

(71) Applicant: ABB Schweiz AG, Baden (CH)

(72) Inventors: Pedro Rodriguez, Västerås (SE); Matti Kivioja, Helsinki (FI); Janne Holla, Helsinki (FI); Tapio Rauhala, Espoo (FI); Ilari Karkkainen, Helsinki (FI)

(73) Assignee: ABB Schweiz AG, Baden (CH)

( * ) Notice: Subject to any disclaimer, the term of this patent is extended or adjusted under 35 U.S.C. 154(b) by 76 days.

(21) Appl. No.: 16/341,312

(22) PCT Filed: Sep. 22, 2017

(86) PCT No.: PCT/EP2017/074045
§ 371 (c)(1),
(2) Date: Apr. 11, 2019

(87) PCT Pub. No.: WO2018/072969
PCT Pub. Date: Apr. 26, 2018

(65) Prior Publication Data
US 2020/0057110 A1    Feb. 20, 2020

(30) Foreign Application Priority Data

Oct. 18, 2016 (EP) ..................... 16194264

(51) Int. Cl.
*G01R 31/34* (2020.01)
*H02P 29/024* (2016.01)

(52) U.S. Cl.
CPC ......... *G01R 31/346* (2013.01); *G01R 31/343* (2013.01); *H02P 29/024* (2013.01)

(58) Field of Classification Search
CPC .... G01R 31/343; G01R 31/346; H02P 29/024
(Continued)

(56) References Cited

U.S. PATENT DOCUMENTS

| 6,933,704 B2 | 8/2005 | Nelson et al. |
| 7,425,771 B2* | 9/2008 | Rivas .................... F03D 7/0224 |
| | | 290/44 |

(Continued)

FOREIGN PATENT DOCUMENTS

| CN | 102636751 A | 8/2012 |
| CN | 103744023 A | 4/2014 |

(Continued)

OTHER PUBLICATIONS

European Office Action Application No. 16 194 264.4 dated Jun. 12, 2020 23 pages.

(Continued)

*Primary Examiner* — Christopher E Mahoney
(74) *Attorney, Agent, or Firm* — Whitmyer IP Group LLC

(57) ABSTRACT

A method for detecting a fault in an AC/AC exciter having an exciter rotor and an exciter stator. A signal reflecting the current or voltage, is obtained at an exciter rotor winding or at an exciter stator winding. A frequency analysis is applied and on the basis of a presence of a frequency component, a rotor current or voltage signal, at a first frequency $f_s^*(2-s)$, where $f_s$ is a supply frequency of the exciter stator and s is an exciter slip, it is determined whether the exciter suffers from an inter-turn short circuit in an exciter stator winding or not. On the basis of a presence of a frequency component, in the case of a stator current signal or a stator voltage signal, at a second frequency $f_s^*(1-2^*s)$, it is determined whether the exciter suffers from an inter-turn short circuit in an exciter rotor winding or not. Presence of frequency components at the first and/or second frequencies in windings of an AC/AC exciter indicate the mentioned fault conditions.

21 Claims, 2 Drawing Sheets

(58) Field of Classification Search
USPC .......................................................... 324/522
See application file for complete search history.

(56) References Cited

U.S. PATENT DOCUMENTS

2012/0001580 A1    1/2012  Zhang et al.
2018/0052206 A1*   2/2018  Rodriguez ........... G01R 31/343

FOREIGN PATENT DOCUMENTS

DE     102014100945 A1    7/2015
EP           2919027 A1    9/2015
EP           2995967 A1    3/2016

OTHER PUBLICATIONS

European Search Report Application No. 16194264.4 Completed: May 3, 2017; dated May 16, 2017 9 Pages.
International Search Report & Written Opinion of the International Searching Authority Application No. PCT/EP2017/074045 Completed: Jan. 12, 2018; dated Jan. 22, 2018 14 Pages.

* cited by examiner

METHOD FOR DETECTING A FAULT IN AN ELECTRICAL MACHINE

TECHNICAL FIELD

The present invention relates to detecting faults in electrical machines.

BACKGROUND

It is conventionally known to detect faults in electrical machines by measuring current and voltage signals from different parts of the machines, and by applying frequency analyses on the measured signals to detect frequency components that are known to indicate faults.

EP2995967A1 discloses a method of determining an electro-mechanical fault condition in a main machine part of a synchronous machine on the basis of measurements of current and voltage signals from an exciter of the synchronous machine.

The conventional methods do not allow a detection of a fault in an exciter of an electrical machine.

SUMMARY

One object of the invention is to provide an improved method enabling a detection of a fault in an exciter of an electrical machine.

These objects are achieved by the method and the device according to the invention.

The invention is based on the realization that presence of certain frequency components in windings of an AC/AC exciter indicate certain fault conditions.

According to a first aspect of the invention, there is provided a method for detecting a fault in an AC/AC exciter comprising an exciter rotor and an exciter stator. The method comprising the steps of: obtaining a rotor current signal or a rotor voltage signal reflecting the current or voltage, respectively, at an exciter rotor winding; applying a frequency analysis on the obtained signal to detect any frequency components; and determining, on the basis of a presence of a frequency component at a first frequency $f_s*(2-s)$, where $f_s$ is a supply frequency of the exciter stator and s is an exciter slip, whether the exciter suffers from an inter-turn short circuit in an exciter stator winding or not.

According to a second aspect of the invention, there is provided a method for detecting a fault in an AC/AC exciter comprising an exciter rotor and an exciter stator. The method comprising the steps of: obtaining a rotor current signal or a rotor voltage signal reflecting the current or voltage, respectively, at an exciter rotor winding; applying a frequency analysis on the obtained signal to detect any frequency components; and determining, on the basis of a presence of a frequency component at a first frequency $f_s*(2-s)$, where $f_s$ is a supply frequency of the exciter stator and s is an exciter slip, whether the exciter suffers from an inter-turn short circuit in an exciter stator winding or not.

According to one embodiment of the invention, the method comprises the step of determining the presence of a frequency component at the first or second frequency, respectively, by comparing an amplitude at the first or second frequency with amplitudes at the respective adjacent frequencies.

According to one embodiment of the invention, the method comprises the step of determining the presence of a frequency component at the first or second frequency, respectively, by comparing an amplitude at the first or second frequency with an amplitude of a reference frequency spectrum at the same frequency.

According to one embodiment of the invention, the reference frequency spectrum is obtained from a healthy AC/AC exciter.

According to one embodiment of the invention, the reference frequency spectrum is obtained from a simulation.

According to one embodiment of the invention, the method comprises the steps of: calculating an average amplitude for a frequency band with a predetermined width, wherein the first or second frequency, respectively, is in the middle of the frequency band; dividing the amplitude at the first or second frequency, respectively, by the average amplitude to thereby obtain a relative amplitude; and comparing the relative amplitude with a predetermined threshold value to determine whether a frequency component is present or not.

According to one embodiment of the invention, the method comprises the steps of: dividing the amplitude at the first or second frequency, respectively, by the amplitude of the reference frequency spectrum at the same frequency to thereby obtain a relative amplitude; and comparing the relative amplitude with a predetermined threshold value to determine whether a frequency component is present or not.

According to one embodiment of the invention, the threshold value is at least two, such as at least five, at least ten, at least twenty, at least fifty, at least hundred, at least five hundred or at least thousand.

According to one embodiment of the invention, the frequency band has a width of at most 100 Hz, such as at most 60 Hz, at most 40 Hz, at most 20 Hz, at most 10 Hz, at most 5 Hz or at most 3 Hz.

According to one embodiment of the invention, the rotor current signal or the rotor voltage signal is obtained by measuring the current or voltage, respectively, from the exciter rotor winding.

According to one embodiment of the invention, the stator current signal or the stator voltage signal is obtained by measuring the current or voltage, respectively, from the exciter stator winding.

According to one embodiment of the invention, the stator current signal or the stator voltage signal is obtained by measuring the current or voltage, respectively, from a converter powering the exciter stator winding.

According to a third aspect of the invention, there is provided an electrical machine comprising at least one instrument and an analysis module configured to carry out a method according to any of the preceding embodiments.

BRIEF DESCRIPTION OF THE DRAWINGS

The invention will be explained in greater detail with reference to the accompanying drawings, wherein.

DETAILED DESCRIPTION

Figure 1:
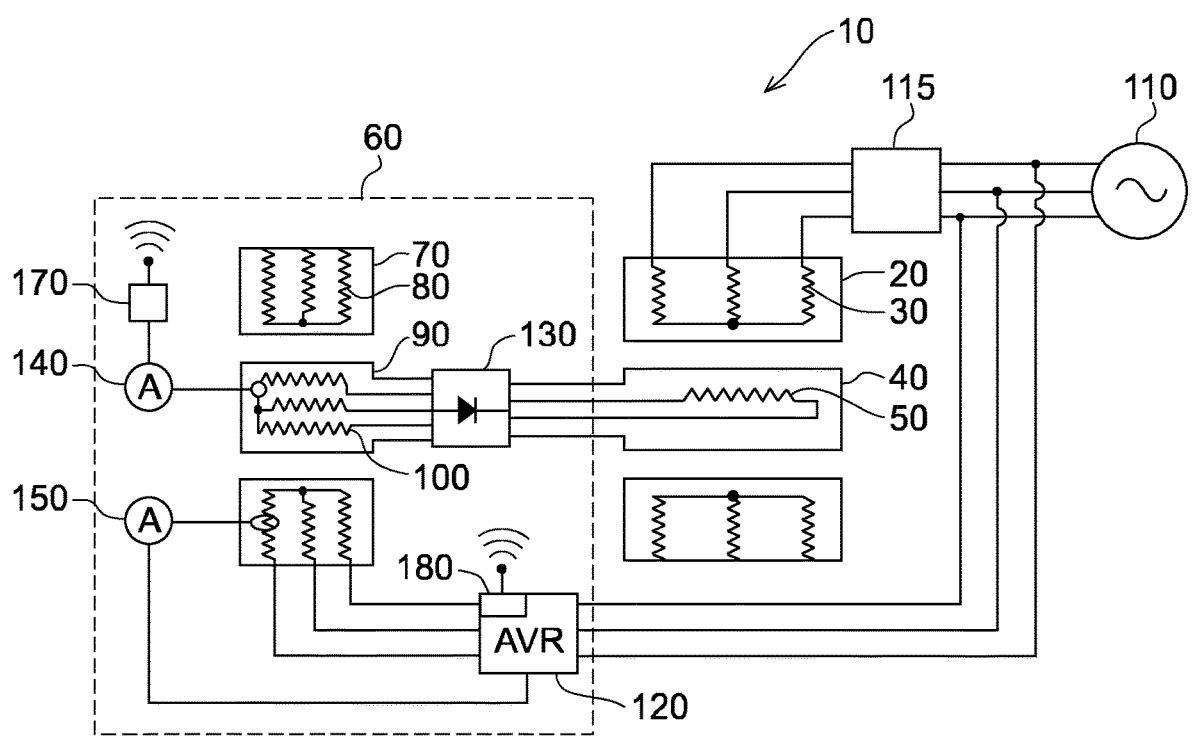
FIG. 1 shows an electrical machine according to one embodiment of the invention.

Referring to FIG. 1, an electrical machine 10 according to one embodiment of the invention comprises a main stator 20 with a respective main stator winding 30, and a main rotor 40 with a respective main rotor winding 50. The main rotor winding 50 is powered by means of an exciter 60 comprising an exciter stator 70 with a respective exciter stator winding 80, and an exciter rotor 90 with a respective exciter rotor winding 100. The exciter stator winding 80 is powered with an AC current. For example, the exciter stator winding 80 can be powered from a same power source 110 as the main stator winding 30, which according to the example of FIG. 1 is powered with a three phase AC current. The AC current to the main stator winding 30 is converted by means of a first converter 115 to adapt the frequency and the amplitude of the AC current for the purposes of driving the electrical machine 10. The AC current to the exciter stator winding 80 is converted by means of a second converter 120 to adapt the frequency and the amplitude of the AC current for the purposes of the excitation. The second converter 120 can for example be an automatic voltage regulator (AVR).

When powered, a rotating magnetic field, an exciter field, is created within the exciter stator 70, and a corresponding AC current is induced in the exciter rotor winding 100. The exciter rotor winding 100 is connected with the main rotor winding 50 via a rectifier 130 rectifying the AC current into a DC current. The exciter 60 thereby features an AC/AC generator in which both the exciter field and the exciter rotor 90 rotate, but with different speeds when any current in the exciter rotor winding 100 is to be induced. A relative difference in the rotational speeds of the exciter field and the exciter rotor 90 is herein termed an "exciter slip" denoted by s, and this type of exciter 60 is termed an "AC/AC exciter".

The exciter slip s is defined by $$s = \left| \frac{n_s - n_r}{n_s} \right|,$$

wherein $n_s$ is a rotational speed of the exciter field, an exciter field speed, and $n_r$ is a rotational speed of the exciter rotor 90, an exciter rotor speed. Theoretically, the exciter slip may obtain any positive value, but in practice it typically obtains values between 0 and 1.5. Exciter slip value s=0 corresponds to a situation where the exciter field speed is equal to the exciter rotor speed i.e., situation where no current is induced in the exciter rotor winding 100. Exciter slip value s=1 corresponds to a situation where the exciter rotor 90 is standing still and the exciter field is not. Exciter slip values s>1 correspond to situations where the exciter field and the exciter rotor 90 rotate in opposite directions, which is a typical case with AC/AC exciters 60 discussed herein. To be sure, the exciter slip discussed in the context of the present invention and AC/AC exciters 60 has nothing to do with rotor slip in the context of induction motors.

The inventors of the present invention have discovered by means of simulations that an inter-turn short circuit in the exciter stator winding 80 of an AC/AC exciter 60 causes a frequency component 160 (see FIG. 2b) at frequency $f_s*(2-s)$, where $f_s$ is a supply frequency of the exciter stator 70 and s is an exciter slip, to be present in the exciter rotor winding 100. The inventors have furthermore discovered that an inter-turn short circuit in the exciter rotor winding 100 of an AC/AC exciter 60 causes a frequency component 160 at frequency $f_s*(1-2*s)$ to be present in the exciter stator winding 80. Therefore, the inventors have been able to arrive at the present invention according to which it is possible to determine whether an AC/AC exciter 60 suffers from inter-turn short circuit in the exciter stator winding 80, or whether an AC/AC exciter 60 suffers from inter-turn short circuit in the exciter rotor winding 100. According to one embodiment of the invention the electrical machine 10 comprises an analysis module 180 that is configured to carry out required operations for detecting the mentioned faults in the AC/AC exciter 60.

In order to detect an inter-turn short circuit in the exciter stator winding 80 of an AC/AC exciter 60 a rotor current signal is obtained by measuring a rotor current from the exciter rotor winding 100 with a first current meter 140. The first current meter 140 is connected wirelessly be means of a wireless device 170 to the analysis module 180 which may for example be integrated into the second converter 120. Instead of the rotor current a rotor voltage can be measured to obtain a corresponding rotor voltage signal. In the context of the present invention any signal reflecting the current or voltage, respectively, at the exciter rotor winding 100 is to be considered a rotor current signal or rotor voltage signal irrespective of where exactly the signal is measured from. A frequency analysis is applied on the obtained signal to detect any frequency components 160. The frequency analysis can be done for example by transforming the obtained signal, which is in time domain, into frequency domain by means of a Fourier transformation, and to thereby obtain a frequency spectrum (see FIGS. 2a and 2b). A frequency component 160 can be defined to be a frequency at which a high amplitude oscillation i.e., an amplitude peak in comparison to amplitudes at adjacent frequencies is present. For determining the amplitudes at the adjacent frequencies, a frequency band with a width of e.g., 10 Hz with the frequency of interest in the middle can be considered, and an average amplitude can be calculated for this frequency band. Instead of considering a frequency band with a width of 10 Hz, a frequency band with any appropriate width can be considered, such as a frequency band with a width of at most 100 Hz, such as at most 60 Hz, at most 40 Hz, at most 20 Hz, at most 10 Hz, at most 5 Hz or at most 3 Hz. The amplitude at the frequency of interest can then be divided by the average amplitude, and the resulting relative amplitude can be compared with a predetermined threshold value to determine whether a frequency component 160 is present or not. That is, if the relative amplitude is greater than the threshold value, a frequency component 160 is considered to be present. The threshold value should be at least two (the amplitude at the frequency of interest is more than two times the average amplitude), such as at least five, at least ten, at least twenty, at least fifty, at least hundred, at least five hundred or at least thousand. If a frequency component 160 at frequency $f_s*(2-s)$ is determined to be present, it is determined that an inter-turn short circuit in the exciter stator winding 80 is present.

Figure 2A:
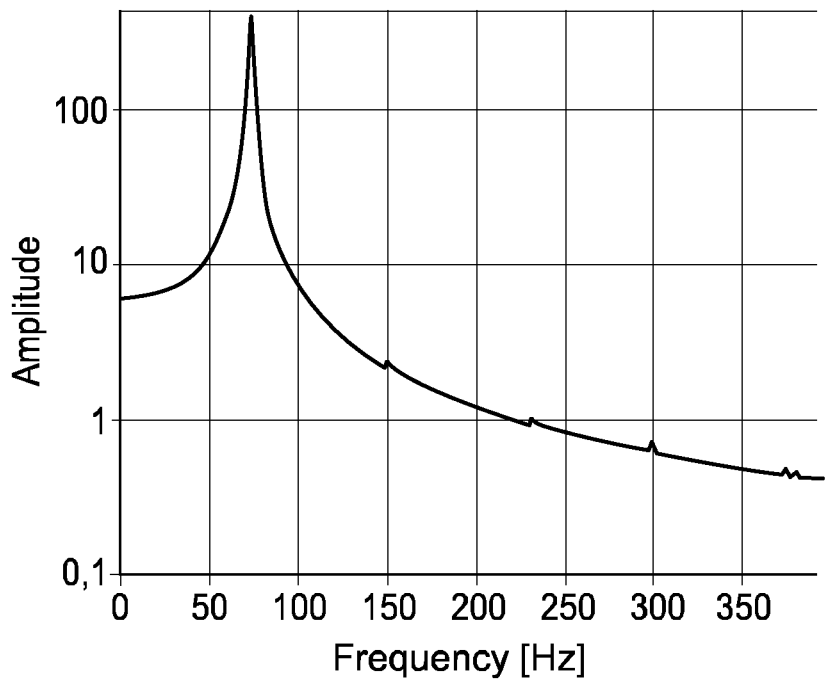
FIG. 2a shows a frequency spectrum of exciter rotor current in a healthy AC/AC exciter.
Figure 2B:
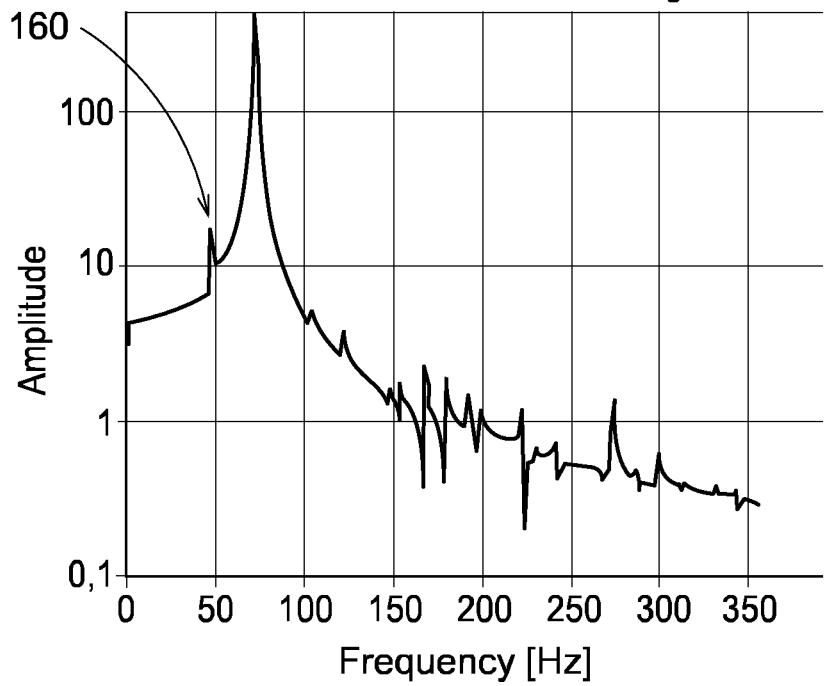
FIG. 2b shows a frequency spectrum of exciter rotor current in an AC/AC exciter with an inter-turn short circuit in the exciter stator winding.

For example, referring to FIGS. 2a and 2b, if the supply frequency $f_s$ of the exciter stator 70 has a value 60 Hz and the exciter slip s has a value 1.2 (the exciter rotor speed is 12 Hz in a direction opposite to the direction of the exciter field speed of 60 Hz, and the main frequency of the rotor current thereby becomes 72 Hz), then the frequency of interest in the exciter rotor winding 100 of the respective AC/AC exciter 60, in order to detect an inter-turn short circuit in the exciter stator winding 80, becomes 48 Hz (60 Hz*(2−1.2)). For determining the amplitudes at the adjacent frequencies an average amplitude for a frequency band with a width of 5 Hz between 45.5 Hz and 50.5 Hz is calculated to thereby obtain an average amplitude. The amplitude at 48 Hz is divided by the average amplitude, and the resulting relative amplitude is compared with a predetermined threshold value, such as ten, to determine whether a frequency component 160 is present or not. If a frequency component 160 at 48 Hz is present, it is determined that an inter-turn short circuit in the exciter stator winding 80 is present.

In order to detect an inter-turn short circuit in the exciter rotor winding 100 of an AC/AC exciter 60 a stator current signal is obtained by measuring a stator current from the exciter stator winding 80 with a second current meter 150. Instead of the stator current a stator voltage can be measured to obtain a corresponding stator voltage signal. In the context of the present invention any signal reflecting the current or voltage, respectively, at the exciter stator winding 80 is to be considered a stator current signal or stator voltage signal irrespective of where exactly the signal is measured from. The stator current and/or the stator voltage can be measured e.g., from the second converter 120. A frequency analysis is applied e.g., as described above on the obtained signal to detect any frequency components 160. If a frequency component 160 at frequency $f_s*(1-2*s)$ is determined to be present, it is determined that an inter-turn short circuit in the exciter rotor winding 100 is present.

Instead of comparing with the amplitudes at adjacent frequencies the amplitude at the frequency of interest can also be divided by an amplitude of a reference frequency spectrum at the same frequency to thereby obtain the relative amplitude. The reference frequency spectrum can be obtained e.g., from a healthy AC/AC exciter 60 that is substantially identical with the exciter 60 to be analyzed. The healthy exciter 60 can for example be a new exciter 60 or an exciter 60 that otherwise is known to function well and can therefore be assumed to provide a good reference frequency spectrum. The reference frequency spectrum can also be obtained from a simulation.

The invention is not limited to the embodiments shown above, but the person skilled in the art may modify them in a plurality of ways within the scope of the invention as defined by the claims.

The invention claimed is:

1. A method for detecting a fault in an AC/AC exciter, comprising an exciter rotor and an exciter stator, the method including the steps of:
   obtaining a rotor current signal or a rotor voltage signal reflecting the current or voltage, respectively, at an exciter rotor winding;
   applying a frequency analysis on the obtained signal to detect any frequency components; and
   determining, on the basis of a presence of a frequency component at a first frequency $f_s*(2-s)$, where $f_s$ is a supply frequency of the exciter stator and s is an exciter slip, whether the exciter suffers from an inter-turn short circuit in an exciter stator winding or not.

2. The method according to claim 1, wherein the method includes the step of:
   determining the presence of a frequency component at the first or second frequency, respectively, by comparing an amplitude at the first or second frequency with amplitudes at the respective adjacent frequencies.

3. The method according to claim 1, including the step of:
   determining the presence of a frequency component at the first or second frequency, respectively, by comparing an amplitude at the first or second frequency with an amplitude of a reference frequency spectrum at the same frequency.

4. The method according to claim 3, wherein the reference frequency spectrum is obtained from a healthy AC/AC exciter.

5. The method according to claim 3, wherein the reference frequency spectrum is obtained from a simulation.

6. The method according to claim 3, wherein the method includes the steps of:
   dividing the amplitude at the first or second frequency, respectively, by the amplitude of the reference frequency spectrum at the same frequency to thereby obtain a relative amplitude; and
   comparing the relative amplitude with a predetermined threshold value to determine whether a frequency component is present or not.

7. The method according to claim 2, wherein the method including the steps of:
   calculating an average amplitude for a frequency band with a predetermined width, wherein the first or second frequency, respectively, is in the middle of the frequency band;
   dividing the amplitude at the first or second frequency, respectively, by the average amplitude to thereby obtain a relative amplitude; and
   comparing the relative amplitude with a predetermined threshold value to determine whether a frequency component is present or not.

8. The method according to wherein the threshold value is at least two.

9. The method according to claim 7, wherein the frequency band has a width of at most 100 Hz, such as at most 60 Hz, at most 40 Hz, at most 20 Hz, at most 10 Hz, at most 5 Hz or at most 3 Hz.

10. The method according to claim 7, wherein the threshold value is at least five.

11. The method according to claim 7, wherein the threshold value is at least ten.

12. The method according to claim 7, wherein the threshold value is at least twenty.

13. The method according to claim 7, wherein the threshold value is at least fifty.

14. The method according to claim 7, wherein the threshold value is at least one hundred.

15. The method according to claim 7, wherein the threshold value is at least five hundred.

16. The method according to claim 7, wherein the threshold value is at least one thousand.

17. An electrical machine comprising at least one instrument and an analysis module configured to carry out a method according to claim 1.

18. The method according to claim 1, wherein the rotor current signal or the rotor voltage signal is obtained by measuring the current or voltage, respectively, from the exciter rotor winding.

19. A method for detecting a fault in an AC/AC exciter comprising an exciter rotor and an exciter stator, the method comprising the steps of: obtaining a stator current signal or a stator voltage signal reflecting the current or voltage, respectively, at an exciter stator winding; applying a frequency analysis on the obtained signal to detect any frequency components; and
   determining, on the basis of a presence of a frequency component at a second frequency $f_s*(1-2*s)$, where $f_s$ is a supply frequency of the exciter stator and s is an exciter slip, whether the exciter suffers from an inter-turn short circuit in an exciter rotor winding or not.

20. The method according to claim 19, wherein the stator current signal or the stator voltage signal is obtained by measuring the current or voltage, respectively, from the exciter stator winding.

21. The method according to claim 19, wherein the stator current signal or the stator voltage signal is obtained by measuring the current or voltage, respectively, from a converters powering the exciter stator winding.

* * * * *